(12) United States Patent
Tagei (10) Patent No.: US 10,201,118 B2
(45) Date of Patent: Feb. 5, 2019

(54) ELECTRIC POWER CONVERTER

(71) Applicant: DENSO CORPORATION, Kariya, Aichi-pref. (JP)

(72) Inventor: Hisato Tagei, Kariya (JP)

(73) Assignee: DENSO CORPORATION, Kariya (JP)

(*) Notice: Subject to any disclaimer, the term of this patent is extended or adjusted under 35 U.S.C. 154(b) by 379 days.

(21) Appl. No.: 14/338,677

(22) Filed: Jul. 23, 2014

(65) Prior Publication Data
US 2015/0029663 A1 Jan. 29, 2015

(30) Foreign Application Priority Data
Jul. 25, 2013 (JP) ................................ 2013-154813

(51) Int. Cl.
*H05K 7/20* (2006.01)

(52) U.S. Cl.
CPC ....... *H05K 7/2089* (2013.01); *H05K 7/20127* (2013.01)

(58) Field of Classification Search
CPC ............. H05K 7/2089; H05K 7/20127; H05K 7/1432; H05K 7/20218; F24F 13/08; H01F 27/085; H01F 27/08; H01F 27/2876; H01F 27/02; H01F 27/10; H01H 9/52; H01L 23/473; G11B 33/142
USPC ........ 361/676, 677, 678, 688–690, 692–693; 257/712, 713, 721, 722; 174/547, 548; 312/236; 454/184
See application file for complete search history.

(56) References Cited

U.S. PATENT DOCUMENTS

| | | | | |
|---|---|---|---|---|
| 5,185,691 A | * | 2/1993 | Korinsky | ........... H05K 7/20509 361/720 |
| 5,258,888 A | * | 11/1993 | Korinsky | ............... H05K 7/209 361/690 |
| 5,831,847 A | * | 11/1998 | Love | ...................... H02M 3/00 361/695 |

(Continued)

FOREIGN PATENT DOCUMENTS

| JP | 2000-232287 | | 8/2000 |
|---|---|---|---|
| JP | 2000232287 A | * | 8/2000 |

(Continued)

OTHER PUBLICATIONS

Yoshiyasu, Kamotani, Spontaneous Air-Cooling Electronic Equipment Enclosure, Aug. 22, 200, Mitsubishi Electric Corp, Entire Document (Translation of JP2000232287).*

(Continued)

*Primary Examiner* — Jerry Wu
*Assistant Examiner* — Stephen S Sul
(74) *Attorney, Agent, or Firm* — Nixon & Vanderhye P.C.

(57) ABSTRACT

The electric power converter has a transformer having a primary coil and a secondary coil, a first circuit section connected to the primary coil side of the transformer, a second circuit section connected to the secondary coil side of the transformer, and a case that accommodates the transformer, the first circuit section, and the second circuit section inside and has a lower opening and an upper opening. An air passage communicated with an exterior of the case is formed inside the case in a vertical direction between the lower opening and the upper opening. At least one of the transformer, the first circuit section, or the second circuit sections is disposed in the air passage.

12 Claims, 9 Drawing Sheets

(56) References Cited

U.S. PATENT DOCUMENTS

| | | | | |
|---|---|---|---|---|
| 7,492,597 | B2* | 2/2009 | Huang | H02M 7/003 |
| | | | | 361/690 |
| 7,817,419 | B2* | 10/2010 | Illerhaus | H02J 7/35 |
| | | | | 165/104.33 |
| 8,743,540 | B1* | 6/2014 | Nishihara | H05K 7/20572 |
| | | | | 165/104.33 |
| 2009/0207566 | A1* | 8/2009 | Appel | H02M 1/32 |
| | | | | 361/692 |
| 2014/0321065 | A1* | 10/2014 | Nishimura | H05K 1/0203 |
| | | | | 361/722 |

FOREIGN PATENT DOCUMENTS

| | | |
|---|---|---|
| JP | 2002-26555 | 1/2002 |
| JP | 2006-180578 | 7/2006 |
| JP | 2006180578 A * | 7/2006 |
| JP | 2008-125249 | 5/2008 |

OTHER PUBLICATIONS

Hayashi Yuji, Yamashita Takeshi, Hirashima Shigeo, "Power Converter", Jul. 6, 2006, Nippon Soken and Denso Corp, Entire Document (Translation of JP 2006180578).*

* cited by examiner

ELECTRIC POWER CONVERTER

CROSS-REFERENCE TO RELATED APPLICATION

This application is based on and claims the benefit of priority from earlier Japanese Patent Application No. 2013-154813 filed Jul. 25, 2013, the description of which is incorporated herein by reference.

TECHNICAL FIELD

The present disclosure relates to an electric power converter equipped with a transformer.

BACKGROUND

As an electric power converter equipped with a transformer, there is a structure having a power inverter circuit mounted on a base plate being covered by a cover which is disclosed in Japanese Patent Application Laid-Open Publication No. 2006-180578, for example.

The cover is provided for protecting the power inverter circuit from water or other foreign substances.

On the other hand, since various kinds of parts including a transformer generate heat during being driven, the electric power converter needs to radiate this heat.

The cooling of the components of the electric power converter is considered to be performed with an air-cooling system.

However, when heat-generating components, such as the transformer, are covered with the cover, it is difficult to air-cool the heat-generating components from outside the cover, and it is difficult to raise the cooling efficiency.

Moreover, since an inner space of the cover may be filled with the heat from the heat-generating components even if the air is simply passed into the cover, it is difficult to cool the heat-generating components efficiently.

SUMMARY

An embodiment provides an electric power converter that has an excellent air-cooling capability.

In an electric power converter according to a first aspect, the electric power converter includes a transformer having a primary coil and a secondary coil, a first circuit section connected to the primary coil side of the transformer, a second circuit section connected to the secondary coil side of the transformer, and a case that accommodates the transformer, the first circuit section, and the second circuit section inside and has a lower opening and an upper opening.

An air passage communicated with an exterior of the case is formed inside the case in a vertical direction between the lower opening and the upper opening, and at least one of the transformer, the first circuit section, or the second circuit sections is disposed in the air passage.

The electric power converter has the air passage communicated with the exterior of the case inside the case, and at least one of the transformer, the first circuit section, or the second circuit sections is disposed in the air passage.

Thereby, the heat-generating portions in the case can be air-cooled.

In addition, the air passage is formed in the up-and-down direction between the lower opening and the upper opening.

Thereby, the air introduced from the lower opening rises through the air passage, and is discharged to out of the case from the upper opening.

In the meantime, the heat-generating portions (at least one of the transformer, the first circuit section, or the second circuit section) in the case can be cooled with the air.

That is, the temperature of the air in the air passage rises due to the heat-exchanging between the heat-generating portions.

The air that has high temperature generates an updraft, rises in the air passage naturally toward the upper opening, and is discharged from the air passage.

In connection with this, external air is introduced into the air passage from the lower opening, and it becomes an updraft similarly and is discharged from the upper opening.

By a continuous air flow by this stack effect, the heat-generating portions in the electric power converter can be cooled efficiently naturally.

According to the present disclosure, the electric power converter that has an excellent air-cooling capability can be provided.

In the electric power converter according to a second aspect, all horizontal circumferences of the air passage are surrounded.

In the electric power converter according to a third aspect, the case is composed of a base plate where the transformer, the first circuit section, and the second circuit section are mounted, and a cover fixed to the base plate and the cover covering the transformer, the first circuit section, and the second circuit section, and the all horizontal circumferences of the air passage are surrounded by a part of the base plate and a part of the cover.

In the electric power converter according to a fourth aspect, the transformer is disposed in the air passage.

In the electric power converter according to a fifth aspect, parts of passage walls surrounding the air passage are constituted to function also as a positioner that positions the transformer.

In the electric power converter according to a sixth aspect, the transformer, the first circuit section, and the second circuit section are disposed in the air passage.

In the electric power converter according to a seventh aspect, there is provided a circuit board that has a control circuit for controlling at least one of the first circuit section or the second circuit section, and the circuit board is disposed in the air passage.

In the electric power converter according to an eighth aspect, a lower wall part and an upper wall part are disposed in a lower end and an upper end of the air passage, respectively, a plurality of holes are provided in the lower wall part and the upper wall part, respectively, and the lower opening and the upper opening are constituted by the plurality of holes, respectively.

In the electric power converter according to a ninth aspect, a lower end and an upper end of the air passage are blocked by the lower wall part and the upper wall part of the case, respectively, and the lower opening and the upper opening are opened toward a horizontal direction in the lower end and the upper end of the cover on a surface opposite to the base plate.

In the electric power converter according to a tenth aspect, a lower projecting plate and an upper projecting plate mounted on the mounting surface are formed in the lower end and the upper end of the base plate, respectively, the lower projecting plate and the upper projecting plate have gaps between the cover, respectively, and each gap is configured to the lower opening and the upper opening, respectively.

DETAILED DESCRIPTION OF THE PREFERABLE EMBODIMENTS

First Embodiment

With reference to FIG. 1-FIG. 4, hereinafter will be described a first embodiment of an electric power converter.

Figure 1:
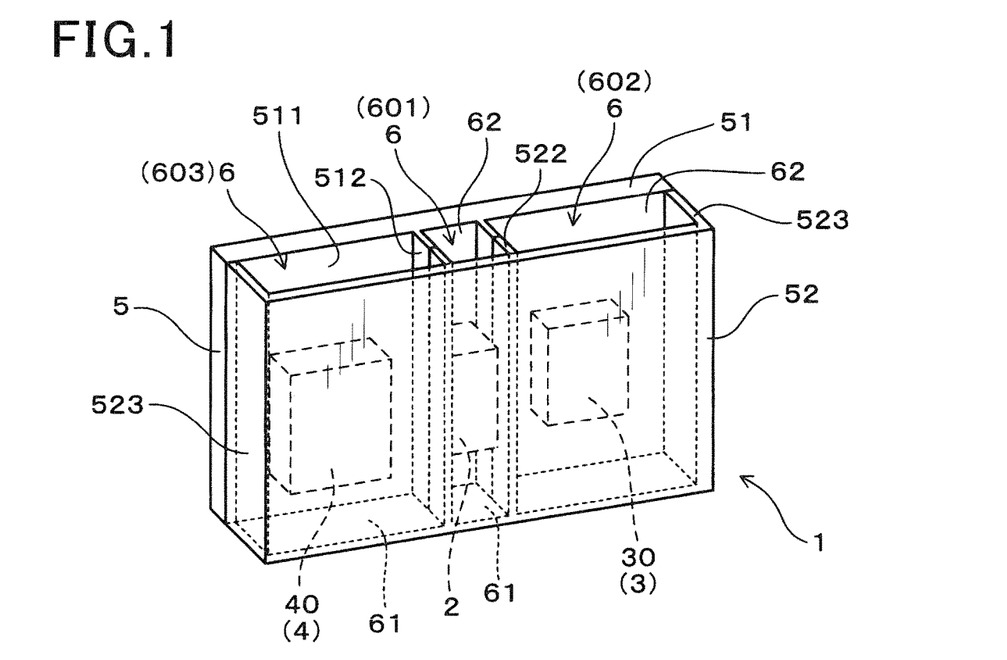
FIG. 1 shows a perspective view of an electric power converter in a first embodiment.
Figure 2:
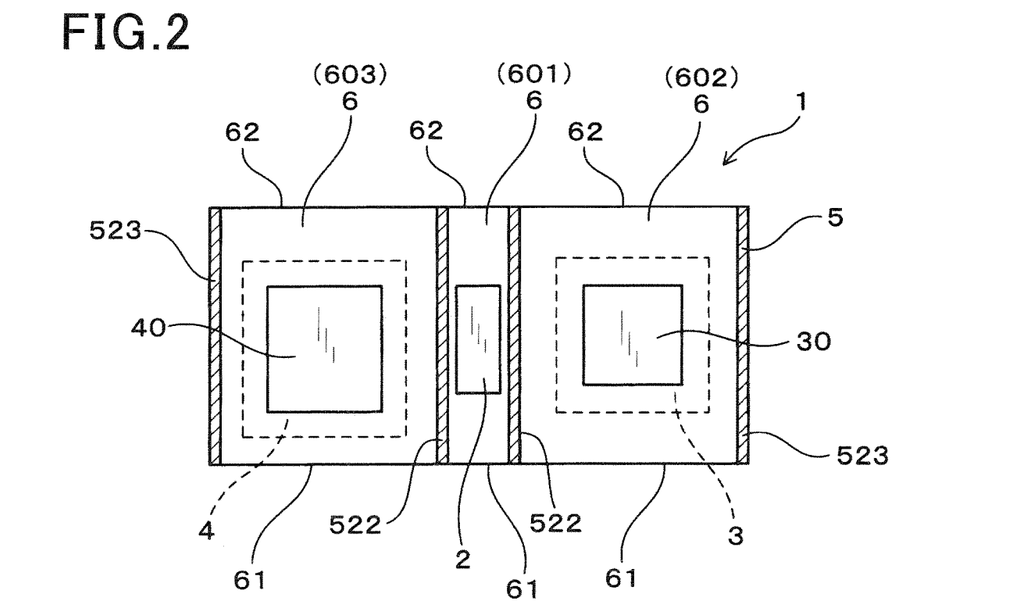
FIG. 2 shows a partial sectional elevational view of the electric power converter in the first embodiment.

An electric power converter 1 of the present embodiment, as shown in FIG. 1 and FIG. 2, has a transformer 2 that has a primary coil and a secondary coil, a first circuit section 3 connected to the primary coil of the transformer 2, a second circuit section 4 connected to the secondary coil side of the transformer 2, and a case 5 that accommodates the transformer 2, the first circuit section 3, and the second circuit section 4 inside.

An air passage 6 communicated with an exterior of the case 5 is formed inside the case 5 in an up-and-down direction (vertical direction) between a lower opening 61 and an upper opening 62.

At least one of the transformer 2, the first circuit section 3, or the second circuit sections 4 is disposed in the air passage 6.

In the present embodiment, three air passages 6 are formed, and the transformer 2, the first circuit section 3, and the second circuit section 4 are disposed at each air passage 6 (601, 602, 603), respectively.

The air passage 602 where the first circuit section 3 is disposed and the air passage 603 where the second circuit section 4 is disposed are disposed respectively on both sides in a horizontal direction of the air passage 601 where the transformer 2 is disposed.

The electric power converter 1 of the present embodiment is a DC-DC converter installed in an electric vehicle, a hybrid car, etc., for example, and is constituted so as to step down a voltage of a direct-current power source to a service voltage for auxiliary machineries.

The first circuit section 3 constitutes a switching circuit that converts a direct-current power supplied from the direct-current power source into an alternating-current power, and has a semiconductor part 30 with a built-in switching element.

An IGBT (insulated gate bipolar transistor), a MOSFET (MOS type field effect transistor), etc., for example, can be used as a switching element.

Moreover, the second circuit section 4 constitutes the rectification circuit for rectifying and outputting a secondary current outputted from the transformer 2 as the direct-current power, and has a diode 40.

In addition, the switching elements such as the IGBT and the MOSFET may be used instead of a diode.

That is, the second circuit section may be constituted as a synchronous rectification circuit using these switching elements.

In addition, although not shown, a choke, a filter, etc. other than the diode 40 are provided in the second circuit section 4.

Figure 3:
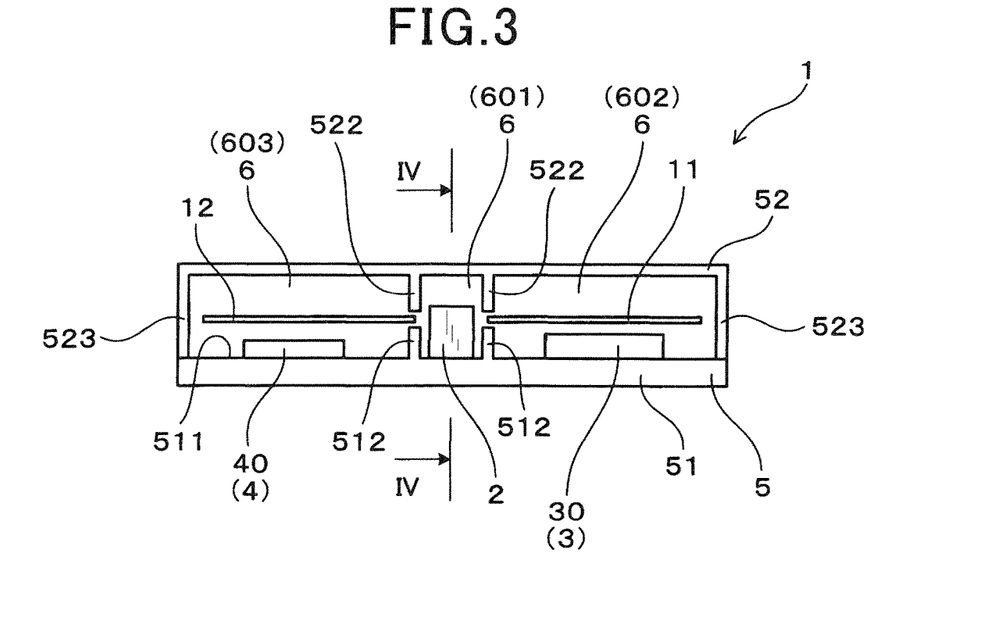
FIG. 3 shows a bottom view of the electric power converter in the first embodiment.

As shown in FIG. 1 and FIG. 3, the case 5 is composed of a base plate 51 where the transformer 2, the first circuit section 3, and the second circuit section 4 are mounted, and a cover 52 fixed to the base plate 51 and covers the transformer 2, the first circuit section 3, and the second circuit section 4.

The base plate 51 has a mounting surface 511 where the components such as the transformer 2 are mounted.

Figure 4:
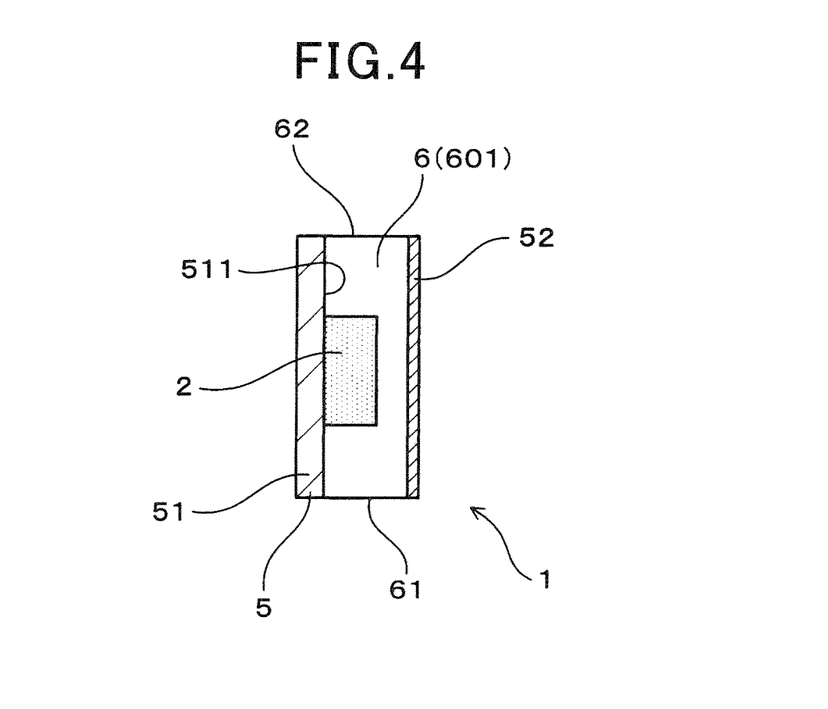
FIG. 4 shows a sectional view taken along a line IV-IV of FIG. 3.

As shown in FIG. 4, the case 5 is installed in a vehicle or the like in a position where a normal direction of the mounting surface 511 of the base plate 51 face the horizontal direction.

All horizontal circumferences of the air passage 6 are surrounded by a part of the base plate 51 and a part of the cover 52.

The base plate 51 has a pair of base side partitions 512 from the mounting surface 511.

The pair of the base side partitions 512 is formed in parallel with each other in the up-and-down direction at right-and-left sides of the transformer 2.

Moreover, the cover 52 has a pair of cover side partitions 522 projected so as to face the pair of the base side partitions 512, and has a pair of side walls 523 projected toward the base plate 51 at both ends of the cover 52 in the horizontal direction.

As shown in FIG. 1 and FIG. 3, the pair of the base side partitions 512 and the pair of the cover side partitions 522 constitute a part of passage walls surrounding the air passage 601.

Moreover, one of the side walls 523, one of the base side partitions 512, and one of the cover side partitions 522 constitute a part of passage walls surrounding the air passage 602.

Furthermore, another one of the side walls 523, another one of the base side partitions 512, and another one of the cover side partitions 522 constitute a part of passage walls surrounding the air passage 603.

That is, each air passage 6 has a composition that in every direction in the horizontal plane, the air passage 6 is surrounded by the base plate 51 and the cover 52.

Both ends in the up-and-down direction of the air passage 6 are opened toward up-and-down direction, respectively, and the air passage 6 has the lower opening 61 and the upper opening 62.

In addition, the base plate 51 and the cover 52 are made of metal in the present embodiment.

Moreover, as shown in FIG. 3, the electric power converter 1 has a circuit board 11 that has a control circuit for controlling the first circuit section 3.

That is, the control circuit provided in the circuit board 11 controls the switching circuit in the first circuit section 3, and controls the on-off of the switching element.

In addition, the circuit board 11 is disposed in the air passage 6 (602).

That is, the circuit board 11 is disposed in the same air passage 602 as the first circuit section 3.

Moreover, the circuit board 11 is disposed in parallel with the mounting surface 511 of the base plate 51 so that the air passage 6 is not blocked.

Moreover, another circuit board 12 is disposed also in the air passage 603 where the second circuit section 4 is disposed.

A part of wirings, etc. of the second circuit section 4 is formed in this circuit board 12.

However, when the second circuit section 4 constitutes the synchronous rectification circuit mentioned above, a control circuit that controls the switching element constituting the synchronous rectification circuit can be formed also in this circuit board 12.

Moreover, this circuit board 12 may be unified with the other circuit board 11.

In addition, this circuit board 12 as well as the other circuit board 11 is disposed in parallel with the mounting surface 511 of the base plate 51.

Next, functions and effects of the present embodiment are explained.

The electric power converter 1 has the air passage 6 communicated with the exterior of the case 5 inside the case 5, and the transformer 2, the first circuit section 3, and the second circuit section 4 are disposed in the air passage 6.

Thereby, the heat-generating portions in the case 5 can be air-cooled.

In addition, the air passage 6 is formed in the up-and-down direction between the lower opening 61 and the upper opening 62.

Thereby, the air introduced from the lower opening 61 rises through the air passage 6, and is discharged to out of the case 5 from the upper opening 62.

In the meantime, the heat-generating portions (or components, i.e., the transformer 2, the first circuit section 3, and the second circuit section 4) in the case 5 can be cooled with air.

That is, the temperature of the air in the air passage 6 rises due to the heat-exchanging between the heat-generating portions.

The air that has high temperature generates an updraft, rises in the air passage 6 naturally toward the upper opening 62, and is discharged from the air passage 6.

In connection with this, external air is introduced into the air passage 6 from the lower opening 61, and it becomes an updraft similarly and is discharged from the upper opening 62.

By a continuous air flow by this stack effect, the heat-generating portions in the electric power converter 1 can be cooled efficiently naturally.

Moreover, since the all the horizontal circumferences of the air passage 6 are surrounded, the updraft by the stack effect becomes easily generated in the air passage 6.

Thereby, the heat-generating portions disposed in the air passage 6 can be air-cooled much more efficiently.

Moreover, it becomes easy to protect the heat-generating portions disposed in the air passage 6 from water or a foreign substance.

Furthermore, the case 5 is composed of the base plate 51 and the cover 52, and the all the horizontal circumferences of the air passage 6 are surrounded by a part of the base plate 51 and a part of the cover 52.

Thereby, while forming the air passage 6, the parts such as the transformer 2, the semiconductor part 30, and the diode 40 can be easily mounted in the case 5.

Moreover, since the transformer 2, the first circuit section 3, and the second circuit section 4 are disposed in the air passage 6, the electric power converter 1 of the present embodiment can air-cool these components efficiently, and can raise cooling efficiency as a whole device.

Moreover, since the circuit board 11 that has the control circuit for controlling the first circuit section 3 is disposed in the air passage 6, the circuit board 11 can also be air-cooled efficiently.

According to the present embodiment, like the above, the electric power converter that has an excellent air-cooling capability can be provided.

Second Embodiment

Figure 5:
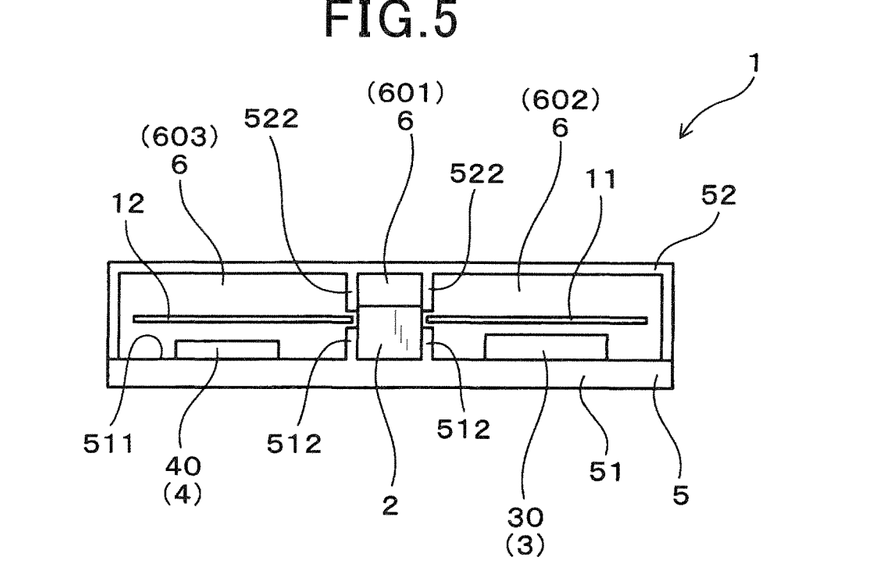
FIG. 5 shows a bottom view of the electric power converter in a second embodiment.

The present embodiment is an example of the electric power converter 1 constituted so that parts of passage walls surrounding the air passage 6 may function also as a positioner that positions the transformer 2, as shown in FIG. 5.

That is, the pair of the base side partitions 512 that constitutes the parts of the passage walls also function as the positioner that positions the transformer 2.

That is, the transformer 2 is sandwiched between the pair of the base side partition parts 512.

Thereby, the transformer 2 is positioned horizontally in a direction parallel to the mounting surface 511 of the base plate 51 by the pair of the base side partitions 512.

The rest of the composition is the same as the first embodiment.

It should be appreciated that, in the second embodiment described above and the subsequent embodiments, components identical with or similar to those in the first embodiment are given the same reference numerals, and structures and features thereof will not be described in order to avoid redundant explanation.

In the present embodiment, the passage walls (base side partitions 512) can be used also as the positioner of the transformer 2.

Therefore, the composition of the case 5 can be simplified.

As a result, weight and cost of the electric power converter 1 can be reduced.

In addition, the present embodiment has the same functions and effects as those of the first embodiment.

Third Embodiment

Figure 6:
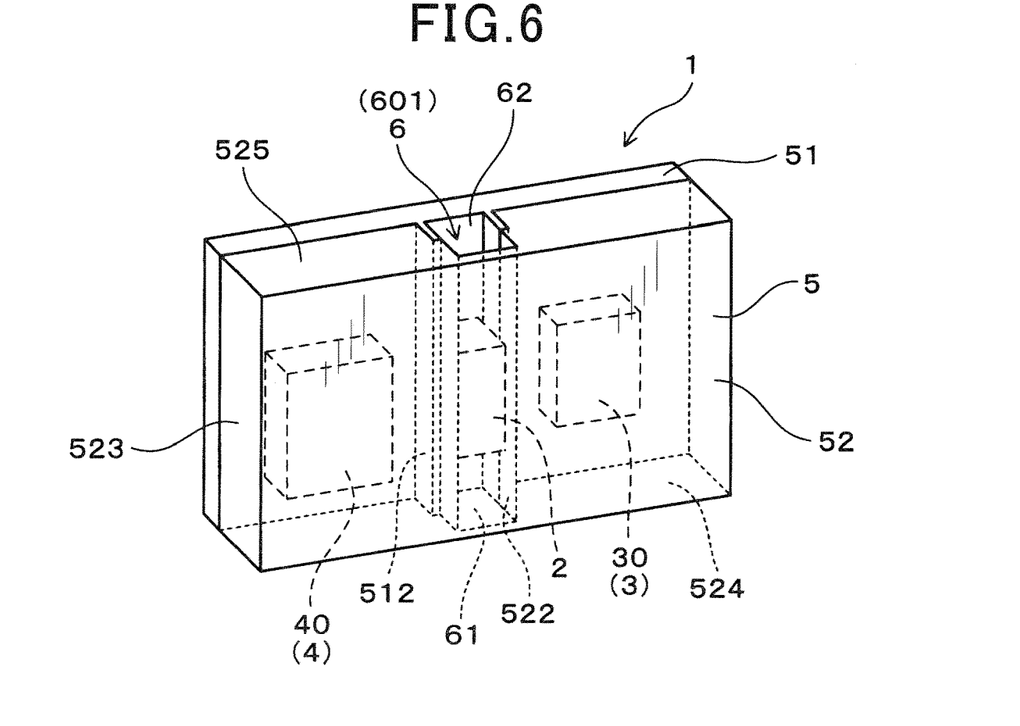
FIG. 6 shows a perspective view of the electric power converter in a third embodiment.
Figure 7:
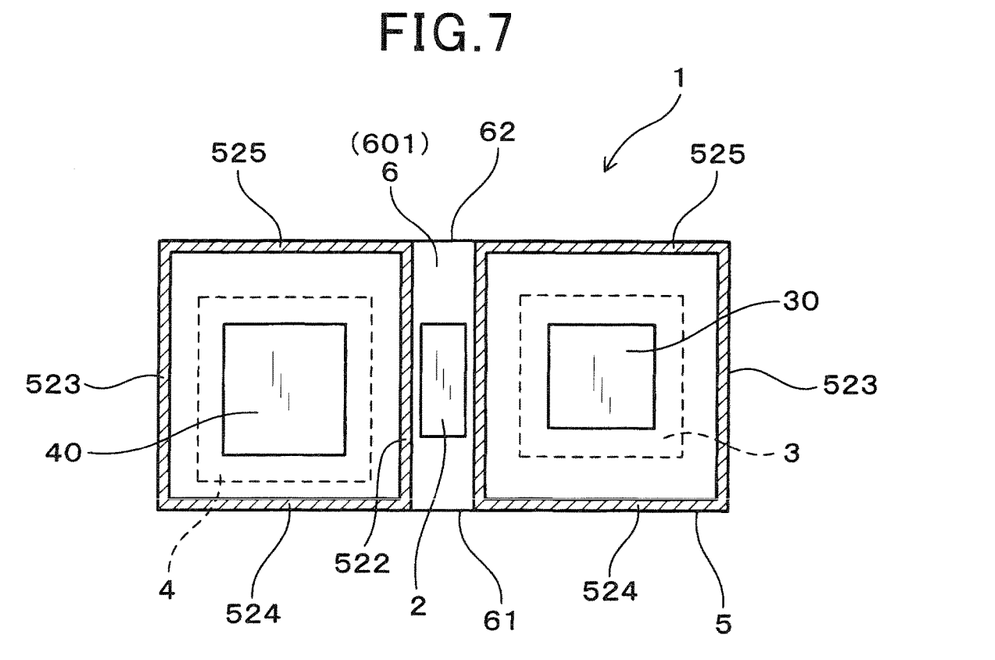
FIG. 7 shows a partial sectional elevational view of the electric power converter in the third embodiment.

As shown in FIG. 6 and FIG. 7, the present embodiment is an example of the electric power converter 1 where the transformer 2 is disposed in the air passage 6, and the first circuit section 3 and the second circuit section 4 are not disposed in the air passage 6.

That is, only the air passage 601 where the transformer 2 is disposed is formed among the three air passages 6 (601, 602, 603) shown in the first embodiment in the electric power converter 1 of the present embodiment.

In addition, a space where the first circuit section 3 is disposed and a space where the second circuit section 4 is disposed are closed not only in the horizontal direction but in the up-and-down direction (vertical direction) by the case 5.

That is, the cover 52 has a lower wall part 524 and an upper wall part 525 in a lower end and an upper end, respectively, in an inner space except the air passage 6 (601).

The rest of the composition is the same as the first embodiment.

In the present embodiment, by disposing the transformer 2 that is especially easy to raise its temperature in the air passage 6, the heat radiation of the transformer 2 can be efficiently performed.

On the other hand, water or foreign substances can be prevented from entering into the first circuit section 3 and the second circuit section 4 more reliably.

In addition, the present embodiment has the same functions and effects as those of the first embodiment.

Fourth Embodiment

Figure 8:
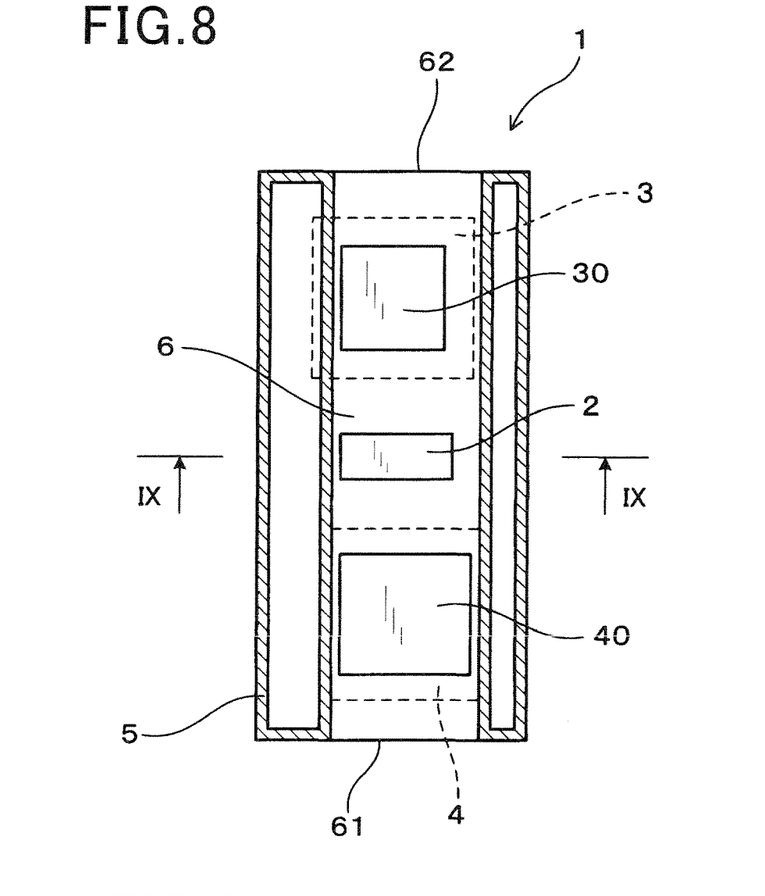
FIG. 8 shows a partial sectional elevational view of the electric power converter in a fourth embodiment.
Figure 9:
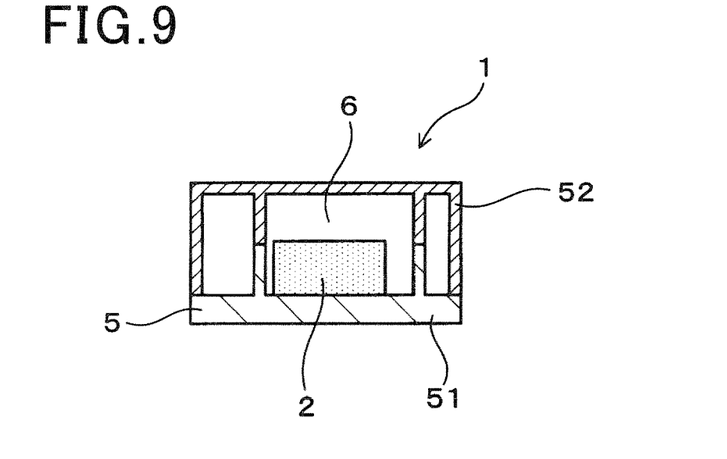
FIG. 9 shows a sectional view taken along a line IX-IX of FIG. 8.

As shown in FIG. 8 and FIG. 9, the present embodiment is an example where the transformer 2, the first circuit section 3, and the second circuit section 4 are arranged in the up-and-down direction (vertical direction), and these components are disposed in a single air passage 6.

The electric power converter 1 is disposed where the first circuit section 3 is located above the transformer 2, and the second circuit section 4 is located under the transformer 2.

Moreover, a single air passage 6 is formed in the up-and-down direction (vertical direction), and the air passage 6 is communicated with the exterior of the case 5 via the lower opening 61 and the upper opening 62 provided at a lower end an upper end of the air passage 6, respectively.

The rest of the composition is the same as the first embodiment.

In the present embodiment, the transformer 2, the first circuit section 3, and the second circuit section 4 can be air-cooled by the single air passage 6.

Moreover, since the air passage 6 can be formed into a comparatively long shape in the vertical direction, the stack effect becomes easier to be generated and can raise the cooling efficiency.

In addition, the present embodiment has the same functions and effects as those of the first embodiment.

It should be noted that a spatial relationship in particular of the transformer 2, the first circuit section 3, and the second circuit section 4 is not limited, and can also be made into a different spatial relationship from the above.

Fifth Embodiment

It should be appreciated that, in the fifth embodiment described below and the subsequent embodiments, components identical with or similar to those in the third embodiment are given the same reference numerals, and structures and features thereof will not be described in order to avoid redundant explanation.

Figure 10:
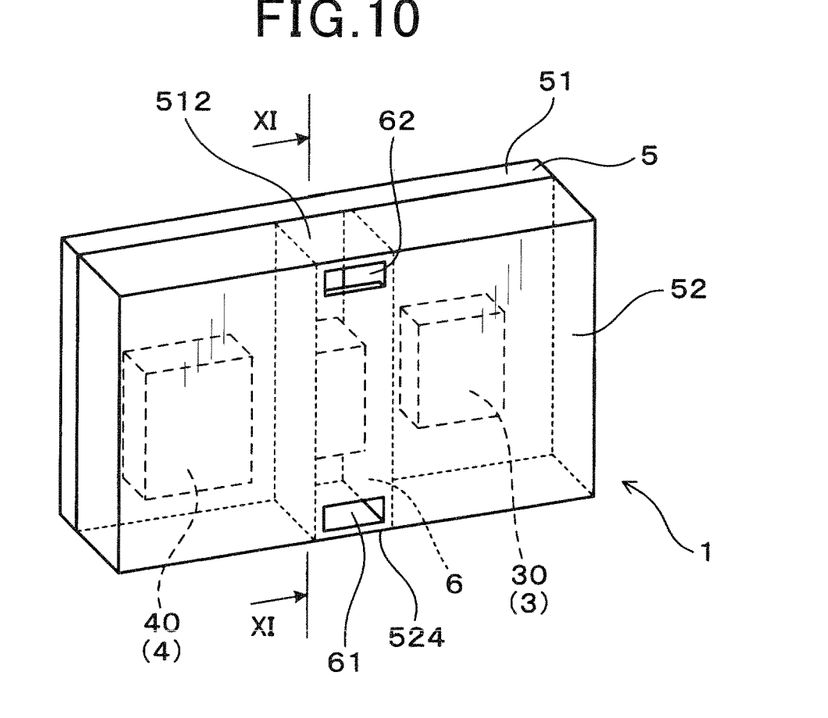
FIG. 10 shows a perspective view of the electric power converter in a fifth embodiment.
Figure 11:
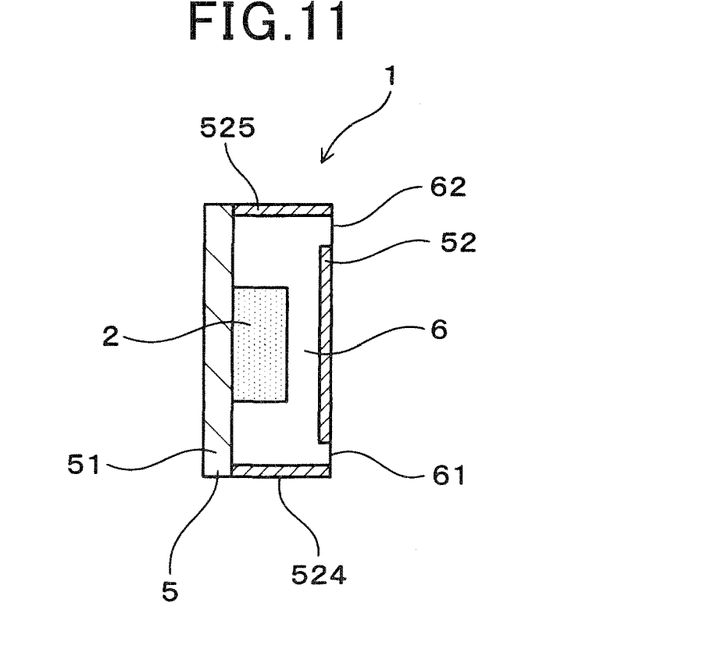
FIG. 11 shows a sectional view taken along a line XI-XI of FIG. 10.

As shown in FIG. 10 and FIG. 11, the present embodiment is an example where the lower opening 61 and the upper opening 62 of the air passage 6 are opened in the horizontal direction.

That is, the lower end and the upper end of the air passage 6 are blocked by the lower wall part 524 and the upper wall part 525 of the case 5, respectively.

Then, openings are provided in the lower end and the upper end of the cover 52 on the surface opposite to the base plate 51, and these openings are configured as the lower opening 61 and the upper opening 62, respectively.

The rest of the composition is the same as the third embodiment.

In the present embodiment, it is easy to protect the transformer 2 against water and foreign substances falling from the above.

In addition, the present embodiment has the same functions and effects as those of the third embodiment.

Sixth Embodiment

Figure 12:
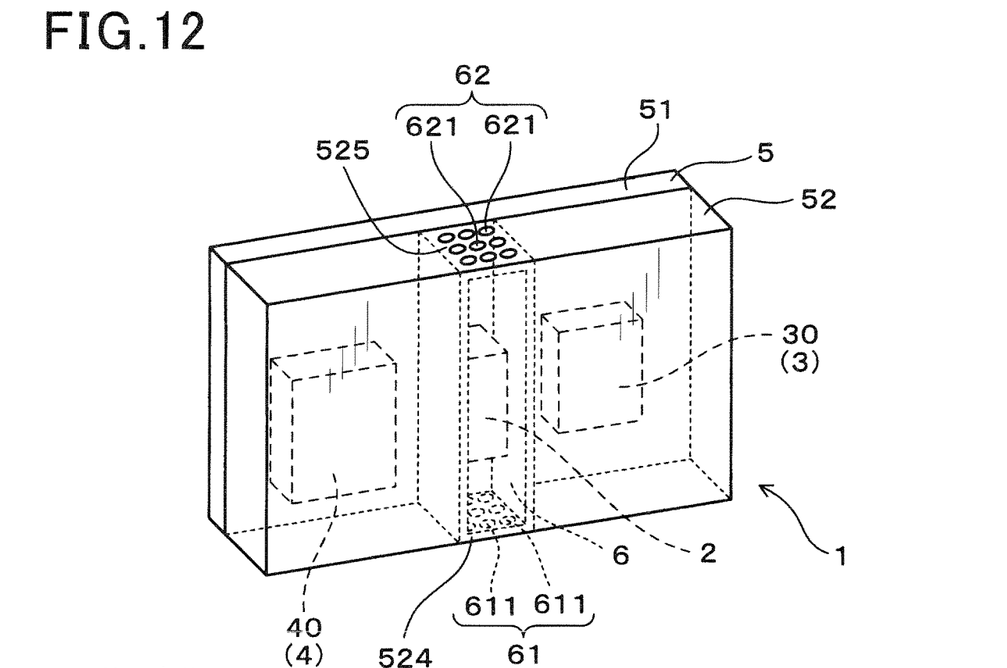
FIG. 12 shows a perspective view of the electric power converter in a sixth embodiment.
Figure 13:
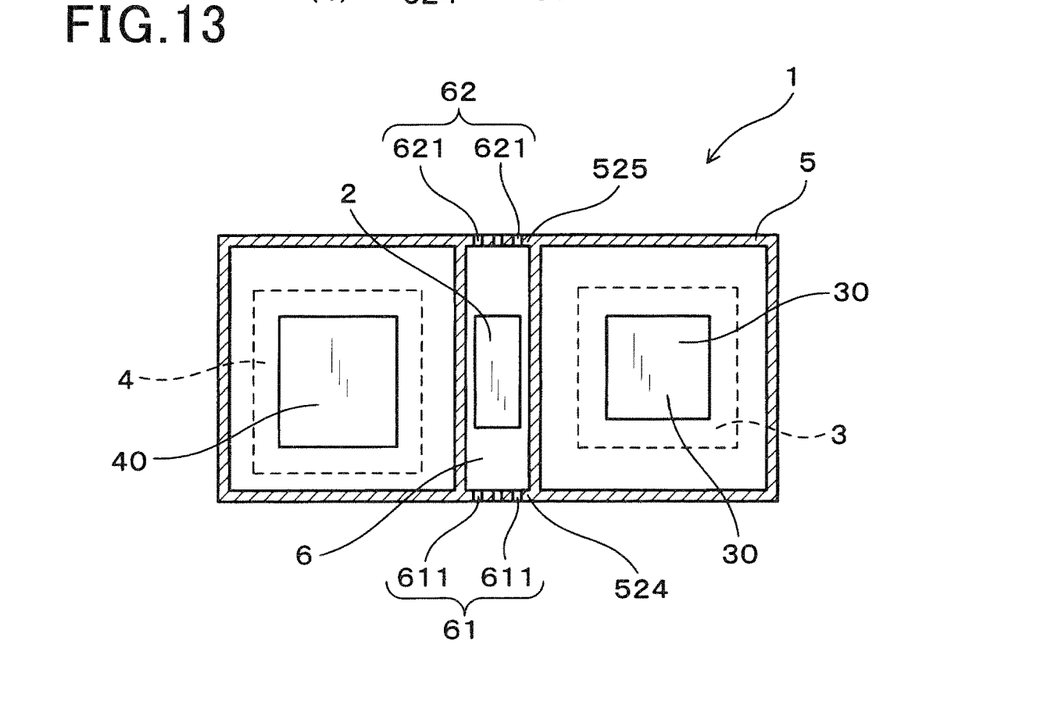
FIG. 13 shows a partial sectional elevational view of the electric power converter in the sixth embodiment.

As shown in FIG. 12 and FIG. 13, the present embodiment is an example where the lower opening 61 and the upper opening 62 of the air passage 6 are constituted by a plurality of holes 611 and 621 provided in the lower wall part 524 and the upper wall part 525, respectively.

The rest of the composition is the same as the third embodiment.

In the present embodiment, it becomes easy to prevent foreign substances, or items such as screws, falling into the transformer 2.

In addition, the present embodiment has the same functions and effects as those of the third embodiment.

Seventh Embodiment

Figure 14:
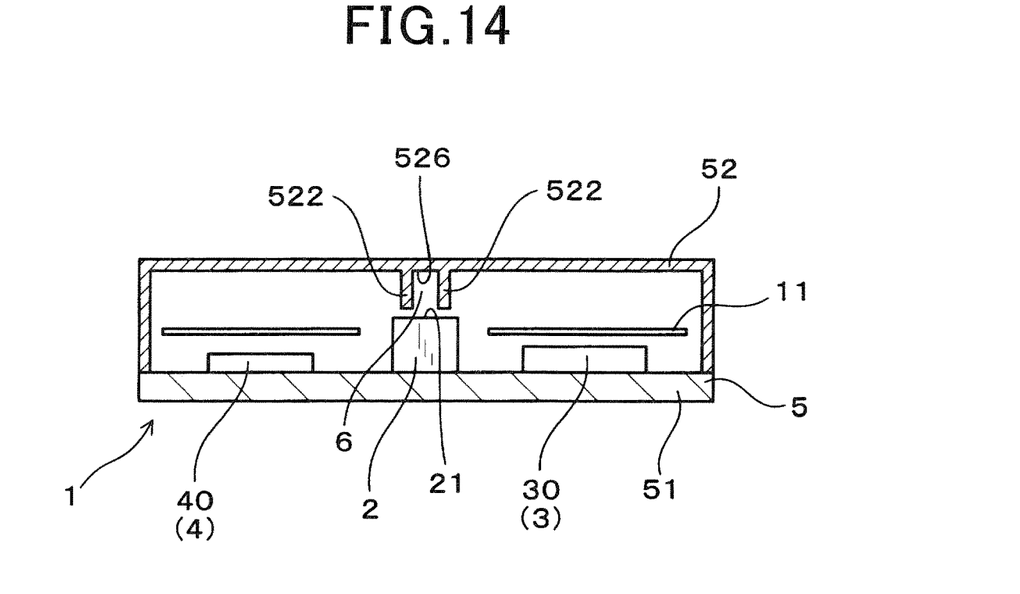
FIG. 14 shows a sectional view in a horizontal plane of the electric power converter in a seventh embodiment.
Figure 15:
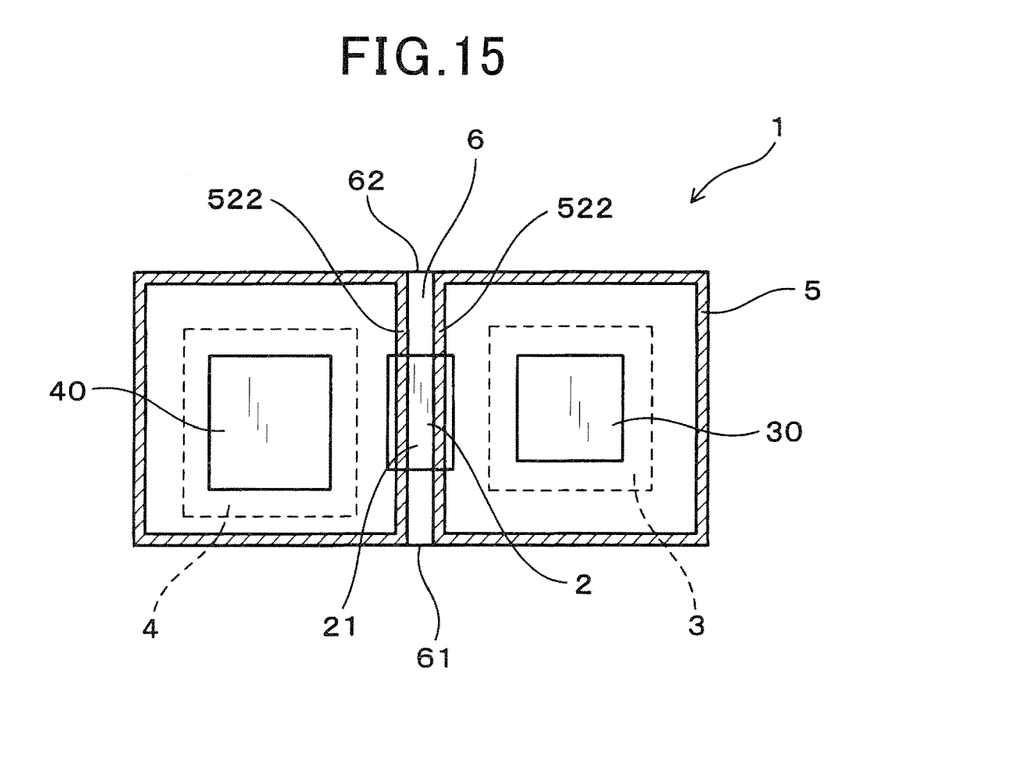
FIG. 15 shows a partial sectional elevational view of the electric power converter in the seventh embodiment.

The present embodiment is an example where the air passage 6 is formed so as to face a surface of the transformer 2 as shown in FIG. 14 and FIG. 15.

In the present embodiment, the pair of the cover side partitions 522 provided in the cover 52 is formed projecting toward the transformer 2.

Thereby, the air passage 6 is formed between the pair of the cover side partitions 522, the surface 21 of the transformer 2, and an inwardly facing side 526 of the cover 52.

The rest of the composition is the same as the third embodiment.

In the present embodiment, the surface 21 of the transformer 2 can be used as a part of passage surfaces of the air passage 6.

Thereby, the composition of the case 5 can be simplified.

In addition, the present embodiment has the same functions and effects as those of the third embodiment.

Eighth Embodiment

Figure 16:
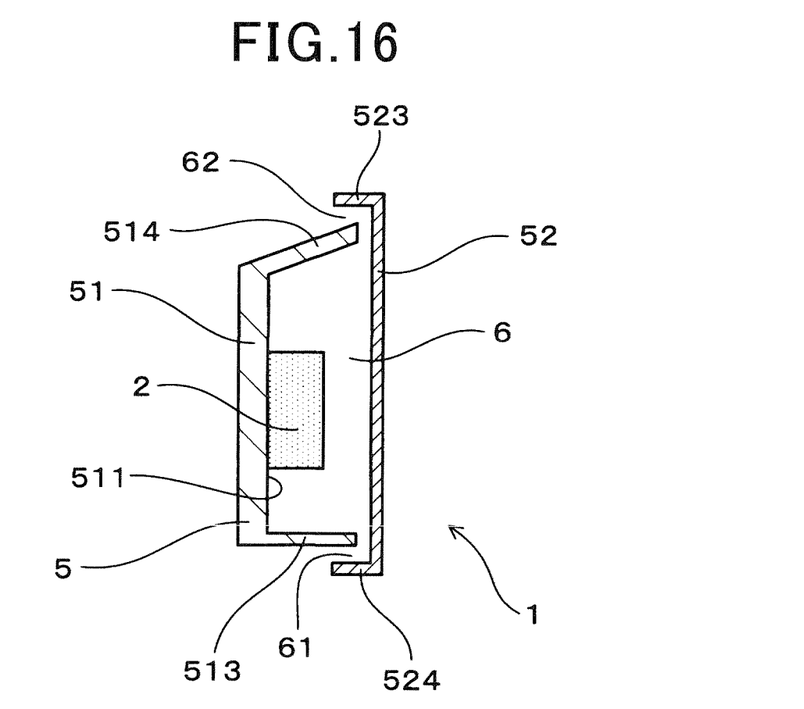
FIG. 16 shows a sectional view in a vertical plane of the electric power converter in an eighth embodiment.

The present embodiment is an example where a lower projecting plate 513 and an upper projecting plate 514 mounted on the mounting surface 511 are formed in the lower end and the upper end of the base plate 51, respectively, as shown in FIG. 16.

The lower projecting plate 513 and the upper projecting plate 514 have gaps between the cover 52, respectively.

Each gap is configured to the lower opening 61 and the upper opening 62, respectively, of the air passage 6.

Further, when seen from the vertical direction, the lower projecting plate 513 overlaps the lower wall part 524 of the cover 52, and the upper projecting plate 514 overlaps the upper wall part 523 of the cover 52.

Moreover, the lower projecting plate 513 is located above the lower wall part 524, and the upper projecting plate 514 is located beneath the upper wall part 523.

The rest of the composition is the same as the first embodiment.

In the present embodiment, it is easy to prevent water and foreign substances from entering into the case 5.

In addition, the present embodiment has the same functions and effects as those of the first embodiment.

Besides the embodiments mentioned above, various compositions can be taken as a composition of the electric power converter.

Moreover, a plurality of embodiments mentioned above may be combined suitably to compose the electric power converter.

Moreover, although the above-mentioned embodiment is an embodiment about a DC-DC converter, other electric power converters such as an AC-DC converter etc. can also be used.

Although at least one of the transformer, the first circuit section, or the second circuit sections is disposed in the air passage as mentioned above, all of them may be disposed in the air passage, or just one of them may be disposed in the air passage.

Moreover, the air passage is desirable that all the horizontal circumferences are surrounded.

In this case, the updraft by the stack effect becomes easily generated in the air passage.

Thereby, the heat-generating portions disposed in the air passage can be air-cooled much more efficiently.

Moreover, it becomes easy to protect the heat-generating portions disposed in the air passage from water or foreign substances.

In addition, the term all the horizontal circumferences includes not only a condition where all the circumferences of the air passage are surrounded entirely, but include a condition where most of all the circumferences of the air passage are surrounded.

That is, a condition where a part of all the horizontal circumferences to the air passage is partially opened is also included to such an extent that the above-mentioned effect is sufficiently obtained.

What is claimed is:

1. An electric power converter comprising:
    a transformer having a primary coil and a secondary coil;
    a first circuit section connected to the primary coil side of the transformer;
    a second circuit section connected to the secondary coil side of the transformer; and
    a case that accommodates the transformer, the first circuit section, and the second circuit section inside and has a lower opening and an upper opening; wherein,
    the case is composed of a base plate where the transformer, the first circuit section, and the second circuit section are mounted, and a cover fixed to the base plate and covers the transformer, the first circuit section, and the second circuit section, and the base plate is arranged in a plane extending between the lower opening and the upper opening of the case;
    an air passage communicated with an exterior of the case is formed inside the case in a vertical direction between the lower opening and the upper opening;
    all horizontal circumferences of the air passage, formed inside the case in the vertical direction between the lower opening and the upper opening, are surrounded by a part of the base plate and a part of the cover;
    the base plate and the cover each has side partitions, the side partitions divide the air passage into a plurality of air passages; and
    at least one of the transformer, the first circuit section, or the second circuit sections is disposed in at least one of the plurality of air passages.

2. The electric power converter according to claim 1, wherein,
    the transformer is disposed in one of the plurality of the air passages.

3. The electric power converter according to claim 2, wherein,
    the side partitions surrounding the air passage are constituted to function also as a positioner that positions the transformer.

4. The electric power converter according to claim 2, wherein,
    the transformer, the first circuit section, and the second circuit section are disposed in one of plurality of the air passages, respectively.

5. The electric power converter according to claim 1, wherein,
    there is provided a circuit board that has a control circuit for controlling at least one of the first circuit section or the second circuit section; and
    the circuit board is disposed in the air passage.

6. The electric power converter according to claim 1, wherein,
    a lower wall part and an upper wall part are disposed in a lower end and an upper end of the air passage, respectively;
    a plurality of holes are provided in the lower wall part and the upper wall part, respectively; and
    the lower opening and the upper opening are constituted by the plurality of holes, respectively.

7. The electric power converter according to claim 1, wherein,
    a lower end and an upper end of the air passage are blocked by the lower wall part and the upper wall part of the case, respectively; and
    the lower opening and the upper opening are opened toward a horizontal direction in the lower end and the upper end of the cover on a surface opposite to the base plate.

8. The electric power converter according to claim 1, wherein,
    a lower projecting plate and an upper projecting plate mounted on the mounting surface are formed in the lower end and the upper end of the base plate, respectively;
    the lower projecting plate and the upper projecting plate have gaps between the cover, respectively; and
    each gap is configured to the lower opening and the upper opening, respectively.

9. The electric power converter according to claim 1, wherein the side partitions in the case form a second air passage in the case and a third air passage in the case;
    wherein the transformer is disposed in the air passage, the first circuit section is disposed in the second air passage, and the second circuit section is disposed in the third air passage.

10. The electric power converter according to claim 9, wherein the air passage having the transformer disposed therein is arranged between the second air passage having the first circuit section disposed therein and the third air passage having the second circuit section disposed therein.

11. The electric power converter according to claim 1, wherein the transformer, the first circuit section, and the second circuit section are disposed in the air passage so that the transformer, the first circuit section, and the second circuit section are aligned in the vertical direction so as to overlap with each other.

12. The electric power converter according to claim 1, wherein the transformer is located, in the vertical direction, between the first circuit section and the second circuit section.

* * * * *